United States Patent
Kim et al.

(10) Patent No.: US 6,559,000 B2
(45) Date of Patent: May 6, 2003

(54) METHOD OF MANUFACTURING A CAPACITOR IN A SEMICONDUCTOR DEVICE

(75) Inventors: Kyong Min Kim, Anyang-Shi (KR); Jong Min Lee, Suwon-Shi (KR); Chan Lim, Ichon-Shi (KR); Han Sang Song, Seoul (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 09/894,920

(22) Filed: Jun. 29, 2001

(65) Prior Publication Data

US 2002/0086480 A1 Jul. 4, 2002

(30) Foreign Application Priority Data

Dec. 29, 2000 (KR) .......................... 2000-85137

(51) Int. Cl.$^7$ .......................................... H01L 21/8242
(52) U.S. Cl. ................. 438/239; 438/685; 438/398; 438/238; 438/240; 438/253; 438/254; 438/396; 438/397; 438/762
(58) Field of Search ............... 438/239, 685, 438/398, 238, 240, 253, 254, 396, 397, 762

(56) References Cited

U.S. PATENT DOCUMENTS

| 5,520,992 | A | | 5/1996 | Douglas et al. |
| 5,861,332 | A | | 1/1999 | Yu et al. |
| 6,015,989 | A | | 1/2000 | Horikawa et al. |
| 6,078,493 | A | * | 6/2000 | Kang ......................... 257/303 |
| 6,087,261 | A | * | 7/2000 | Nishikawa et al. ...... 427/126.3 |
| 6,096,592 | A | * | 8/2000 | Cho ............................ 438/238 |
| 6,179,920 | B1 | * | 1/2001 | Tarutani et al. ............. 118/715 |
| 6,211,556 | B1 | * | 4/2001 | Wu ............................. 257/336 |
| 6,239,460 | B1 | * | 5/2001 | Kuroiwa et al. ............ 257/300 |
| 6,303,427 | B1 | * | 10/2001 | Song et al. ................. 438/197 |
| 6,342,712 | B1 | * | 1/2002 | Miki et al. .................. 257/295 |
| 6,376,299 | B1 | * | 4/2002 | Joo et al. .................... 257/295 |

FOREIGN PATENT DOCUMENTS

| JP | 9-116115 | | 5/1997 | |
| JP | 11-121711 | | 4/1999 | |
| JP | 11-135749 | | 5/1999 | |
| JP | 2000-12796 | | 1/2000 | |
| JP | 2000-183303 | | 6/2000 | |
| JP | 2000281694 | * | 10/2000 | ........... C07F/17/02 |
| KR | 2000-0007684 | | 2/2000 | |

* cited by examiner

Primary Examiner—Matthew Smith
Assistant Examiner—V. Yevsikov
(74) Attorney, Agent, or Firm—Morgan, Lewis & Bockius LLP

(57) ABSTRACT

There is disclosed a method of manufacturing a capacitor in a semiconductor device. The present invention forms a Ru film as a lower electrode of the capacitor in which a $Ta_2O_5$ film is used as a dielectric film by introducing Ru of a raw material, oxygen and $NH_3$ in order to reduce oxygen or a $NH_3$ plasma process as a subsequent process is performed in order to remove oxygen existing on the surface of the Ru film. Therefore, the present invention can prevent oxidization of a diffusion prevention film due to oxygen existing in a Ru film during annealing process performed after deposition of a $Ta_2O_5$ film and thus improve reliability of the device.

32 Claims, 8 Drawing Sheets

METHOD OF MANUFACTURING A CAPACITOR IN A SEMICONDUCTOR DEVICE

BACKGROUND OF THE INVENTION

1. Field of the Invention

The invention relates generally to a method of manufacturing a capacitor in a semiconductor device. More particularly, the invention relates to a method of manufacturing a capacitor in a semiconductor device capable of preventing oxidization of a diffusion prevention film due to oxygen existing in a Ru film during annealing process performed after deposition of a $Ta_2O_5$ film, thus improving reliability of the device, in such a way that the Ru film as a lower electrode of the capacitor in which a $Ta_2O_5$ film is used as a dielectric film is formed by introducing Ru of a raw material, oxygen and $NH_3$ in order to reduce oxygen or a $NH_3$ plasma process as a subsequent process is performed in order to remove oxygen existing on the surface of the Ru film.

2. Description of the Prior Art

As the integration level of devices becomes higher, in order to secure the capacitance of a capacitor in which a $Ta_2O_5$ film is used as a dielectric film, it is required that the thickness of the $Ta_2O_5$ film be smaller. However, there is a problem that this causes an increased leakage current. Therefore, in order to solve the problem, there is a method of forming a lower electrode of the capacitor with a metal, thus securing the capacitance. The characteristic of the leakage current could be also improved depending on the film quality of this lower electrode.

The Ru film, that is widely used as the lower electrode, is deposited by using Tri(2,4-octanedionato)ruthenium as a raw material by means of LPCVD method. At this time, oxygen is used as a reaction gas wherein oxygen gas functions to facilitate deposition of Ru since it disrupts the molecular structure of Tri(2,4-octanedionato) ruthenium being a raw material. If oxygen is used as a reaction gas, however, there is a problem that oxygen may exist within the Ru film. Therefore, after deposition of a $Ta_2O_5$ film, a TiN film of a diffusion prevention film formed in the bottom is oxidized through annealing process, thus forming a dual capacitor or causing a film lift phenomenon.

SUMMARY OF THE INVENTION

It is therefore an object of the present invention to provide a method of manufacturing a capacitor in a semiconductor device capable of preventing oxidization of an underlying diffusion prevention film, by reducing oxygen being a reaction gas for forming a Ru film when the Ru film is used as a lower electrode.

According to a first embodiment of the present invention, a raw material of Ru, and oxygen and $NH_3$ are introduced to dissolve the raw material by means of oxygen within the Ru film and thus to reduce oxygen by means of $NH_3$, so that oxygen does not allowed to exist within the Ru film.

Also, according to a second embodiment of the present invention, a process by which a raw material of Ru, and oxygen and $NH_3$ are introduced to deposit a Ru film in a desired thickness, and a $NH_3$ plasma process is performed to remove oxygen within the Ru film, is implemented by a desired times.

Further, according to a third embodiment of the present invention, a process by which a raw material of Ru, and oxygen and $NH_3$ gases are introduced to dissolve the raw material by means of oxygen, a Ru film is deposited by a desired thickness by reducing oxygen by means of $NH_3$ and a $NH_3$ plasma process is then performed to remove oxygen existing within the Ru film, is implemented by a desired times.

In order to accomplish the above object, a method of manufacturing a capacitor in a semiconductor device according to a first embodiment of the present invention is characterized in that it comprises the steps of mounting a semiconductor substrate in which given structures are formed onto a furnace and then maintaining the furnace at given temperature and pressure; introducing a Ru raw material, oxygen and a $NH_3$ gas into said furnace to form a Ru film on said semiconductor substrate; and forming a lower electrode by patterning said Ru film and then forming a dielectric film and an upper electrode on the entire structure.

Also, a method of manufacturing a capacitor in a semiconductor device according to a second embodiment of the present invention is characterized in that it comprises the steps of mounting a semiconductor substrate in which given structures are formed onto a furnace and then maintaining the furnace at given temperature and pressure; forming a Ru film on said semiconductor substrate by introducing a Ru raw material and oxygen into said furnace and then performing a $NH_3$ plasma process for said Ru film; and forming a lower electrode by patterning said Ru film and then forming a dielectric film and an upper electrode on the entire structure.

Further, a method of manufacturing a capacitor in a semiconductor device according to a third embodiment of the present invention is characterized in that it comprises the steps of mounting a semiconductor substrate in which given structures are formed onto a furnace and then maintaining the furnace at given temperature and pressure; forming a Ru film by introducing a Ru raw material, oxygen and a $NH_3$ gas into said furnace and then performing a $NH_3$ plasma process for said Ru film; and forming a lower electrode by patterning said Ru film and then forming a dielectric film and an upper electrode on the entire structure.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
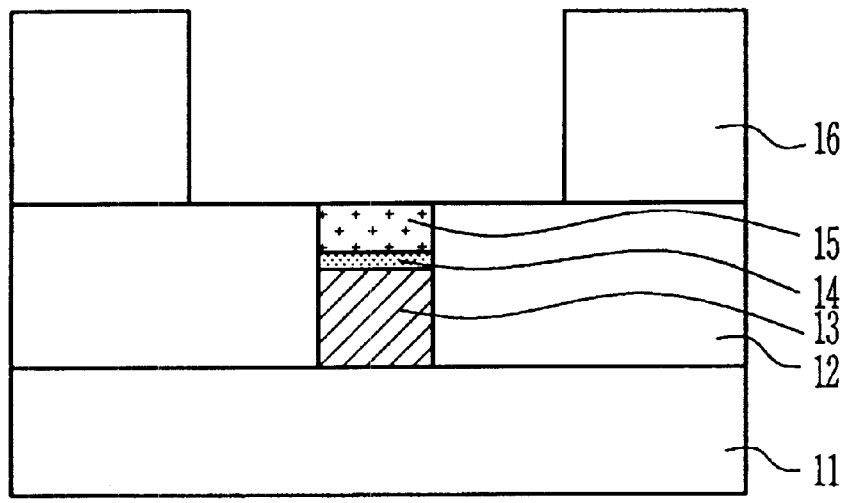
FIG. 1A~FIG. 1C are cross-sectional views of devices for illustrating a method of manufacturing a capacitor in a semiconductor device according to a first embodiment of the present invention.

The present invention will be described in detail by way of a preferred embodiment with reference to accompanying drawings, in which like reference numerals are used to identify the same or similar parts.

Figure 1B:
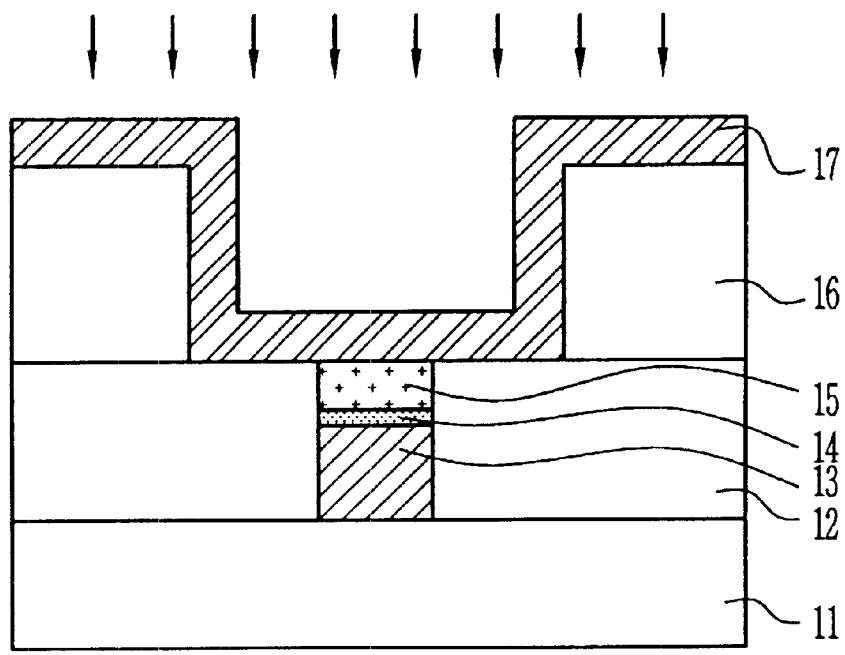
Figure 1C:
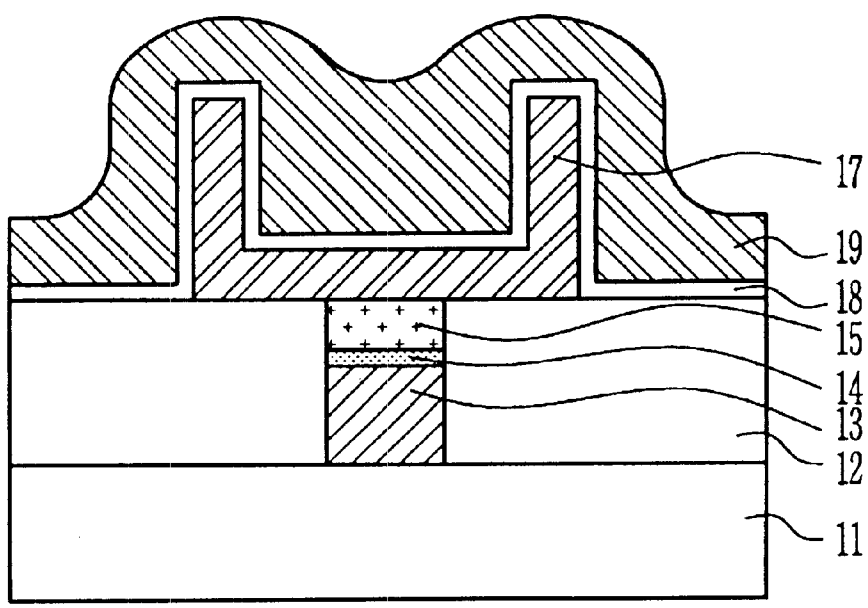

Referring now to FIG. 1A~FIG. 1C, a method of manufacturing a capacitor in a semiconductor device according to a first embodiment of the present invention will be below explained in detail.

Referring now to FIG. 1A, after forming an interlayer insulating film 12 in a semiconductor substrate 11 in which given structure are formed, a given region of the interlayer insulating film 12 is etched to form a contact hole through which a given region of the semiconductor substrate 11 is exposed. Then, a contact plug 13, an ohmic contact layer 14 and a diffusion prevention film 15 are sequentially stacked/filled in the contact hole. Generally, a polysilicon film is used as the contact plug 13, a Ti film is used as the ohmic contact layer 14, and a TiN film is used as the diffusion prevention film 15. Next, an oxide film 16 is formed on the entire structure and is then patterned to expose the contact hole.

Referring now to FIG. 1B, a wafer is mounted on the chamber and is then maintained at the temperature of 250~350° C. under the pressure of 0.1~10 Torr. Tri(2,4-octanedionato)ruthenium or bis(ethyl-cyclopentadienyl) ruthenium of a gas state being a raw material of Ru and oxygen, and a NH$_3$ gas are introduced into the chamber to deposit a Ru film 17 in thickness of 100~500 Å. At this time, oxygen as a reaction gas for dissolving the raw material is introduced with the amount of 10~100 sccm and NH$_3$ gas for reducing oxygen is introduced with the amount of 100~2000 sccm.

Referring now to FIG. 1C, after removing the Ru film 17 formed on the oxide film 16, the oxide film is removed to form a cylinder-shape lower electrode. Then, a Ta$_2$O$_5$ film 18 is formed on the entire structure including the lower electrode. At this time, the Ta$_2$O$_5$ film 18 is formed by introducing tantalum ethylate (Ta(OC$_2$H$_5$)$_5$) of a gas state being a raw material and oxygen of 10~1000 sccm with the temperature of the chamber on which the wafer is mounted kept at 300~450° C. and the pressure is kept at 0.1~2 Torr. Tantalum ethylate is made in a gas state in the vaporizer in which the temperature of 170~190° C. is maintained. In order to remove carbon existing in the Ta$_2$O$_5$ film 18, N$_2$O plasma, O$_2$ plasma or a mixture plasma process of N$_2$ and O$_2$ is performed. Also, in order to crystalline the Ta$_2$O$_5$ film 18, rapid thermal process is performed at the temperature of 500~700° C. for 1~5 minutes. Then, a TiN film or a Ru film is deposited on the entire structure to form an upper electrode 19. At this time, in order to deposit the Ru film used as the upper electrode, the same method of forming the Ru film used the lower electrode may be performed or a general method may be performed.

Referring now to FIG. 2A~FIG. 2D, a method of manufacturing a capacitor in a semiconductor device according to a second embodiment of the present invention will be below explained in detail.

Figure 2A:
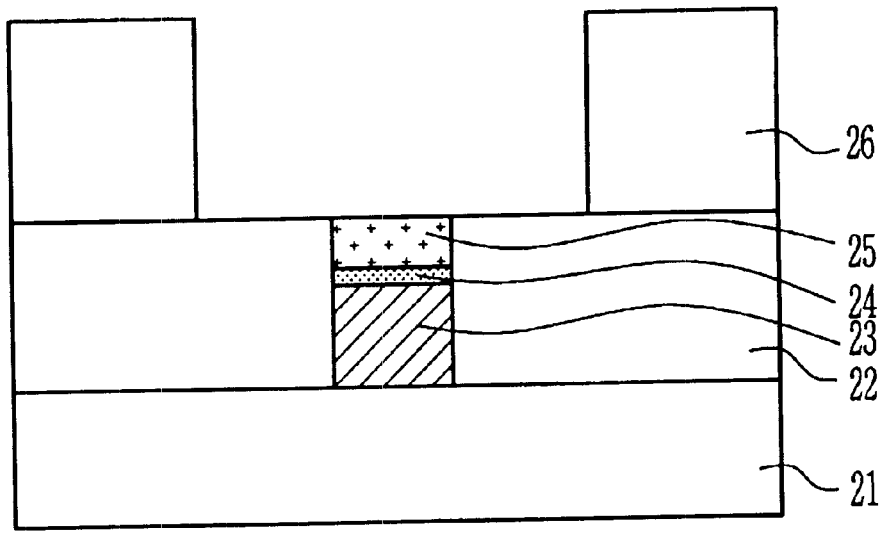
FIG. 2A~FIG. 2D are cross-sectional views of devices for illustrating a method of manufacturing a capacitor in a semiconductor device according to a second embodiment of the present invention.

Referring now to FIG. 2A, after forming an interlayer insulating film 22 in a semiconductor substrate 21 in which given structure are formed, a given region of the interlayer insulating film 22 is etched to form a contact hole through which a given region of the semiconductor substrate 21 is exposed. Then, a contact plug 23, an ohmic contact layer 24 and a diffusion prevention film 25 are sequentially stacked/filled in the contact hole. Generally, a polysilicon film is used as the contact plug 23, a Ti film is used as the ohmic contact layer 24, and a TiN film is used as the diffusion prevention film 25. Next, an oxide film 26 is formed on the entire structure and is then patterned to expose the contact hole.

Figure 2B:
Figure 2B:
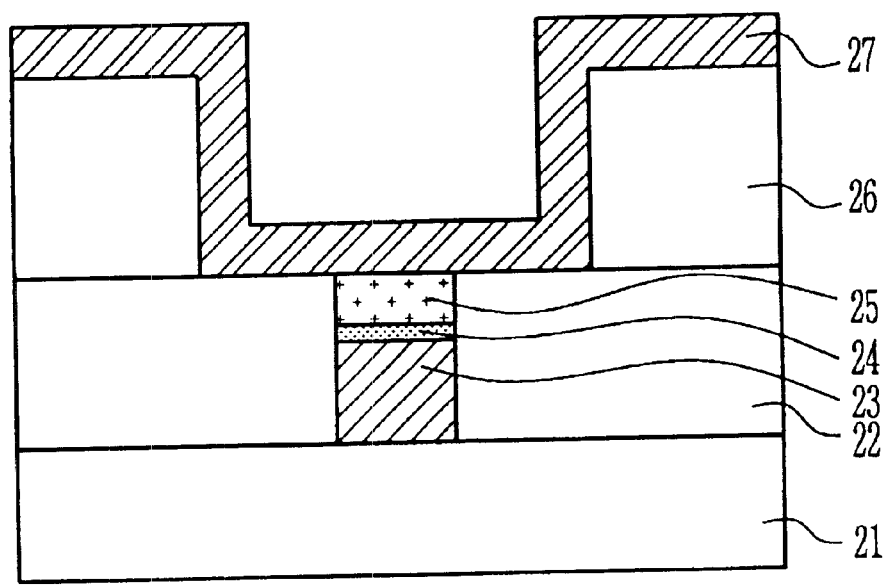

Referring now to FIG. 2B, a wafer is mounted on the chamber and is then maintained at the temperature of 250~350° C. under the pressure of 0.1~10 Torr. Tri(2,4-octanedionato)ruthenium or bis(ethyl-cyclopentadienyl) ruthenium of a gas state being a raw material of Ru and oxygen are introduced into the chamber to deposit a Ru film 27 in thickness of 100~500 Å. At this time, oxygen as a reaction gas for dissolving the raw material is introduced with the amount of 50~800 sccm.

Figure 2C:
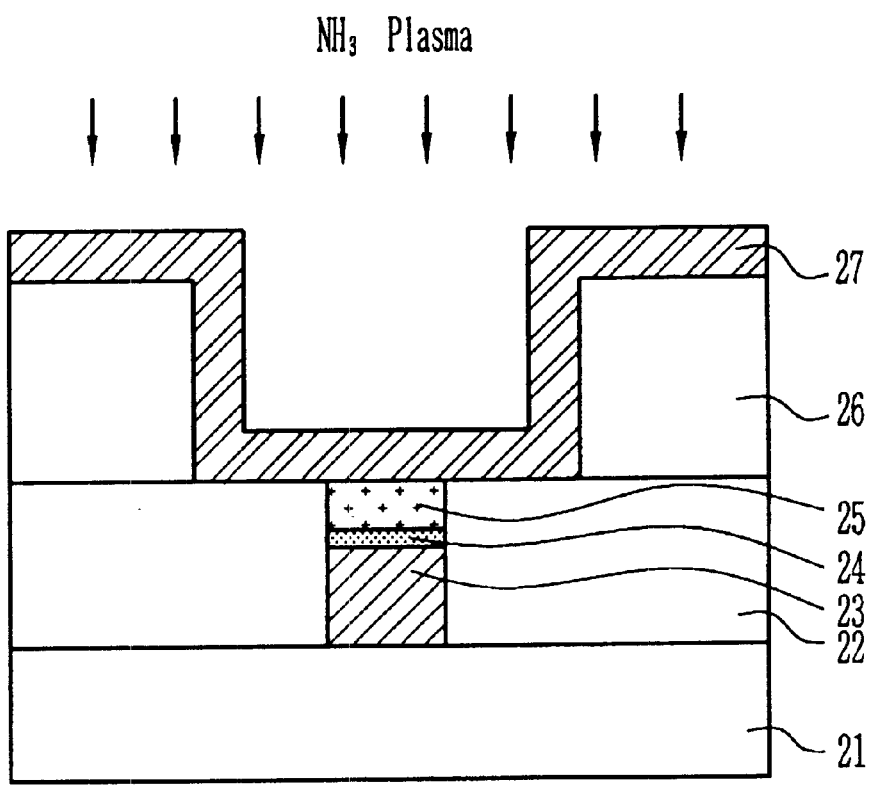

Referring now to FIG. 2C, with introduction of the raw material of Ru and oxygen stopped, the Ru film 27 is experienced by NH$_3$ plasma process, thus removing oxygen existing on the surface of the Ru film 27. At this time, the NH$_3$ plasma process is implemented by introducing a NH$_3$ gas of 10~1000 sccm with the RF power of 30~500W for 1~5 minutes. The above deposition process of the Ru film 27 and the plasma process are repeated to form the Ru film 27 having a desired thickness.

Figure 2D:
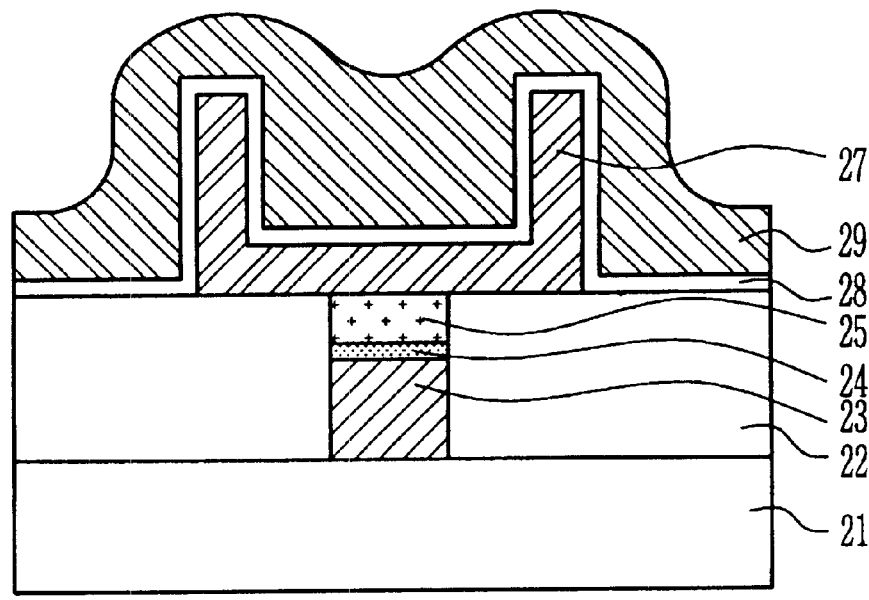

Referring now to FIG. 2D, after removing the Ru film 27 formed on the oxide film 26, the oxide film is removed to form a cylinder-shape lower electrode. Then, a Ta$_2$O$_5$ film 28 is formed on the entire structure including the lower electrode. At this time, the Ta$_2$O$_5$ film 28 is formed by introducing tantalum ethylate (Ta(OC$_2$H$_5$)$_5$) of a gas state being a raw material and oxygen of 10~1000 sccm with the temperature of the chamber on which the wafer is mounted kept at 300~450° C. and the pressure kept at 0.1~2 Torr. Tantalum ethylate is made in a gas state in the vaporizer in which the temperature of 170~190° C. is maintained. In order to remove carbon existing in the Ta$_2$O$_5$ film 28, N$_2$O plasma or UV/O$_3$ plasma is performed at the temperature of 300~500° C. Also, in order to crystalline the Ta$_2$O$_5$ film 28, a rapid thermal process is performed using N$_2$ gas and O$_2$ gas at the temperature of 500~650° C. for 1~5 minutes. Then, a TiN film or a Ru film is deposited on the entire structure to form an upper electrode 29. At this time, in order to deposit the Ru film used as the upper electrode, the same method of forming the Ru film used the lower electrode may be performed or a general method may be performed.

Referring now to FIG. 3A~FIG. 3D, a method of manufacturing a capacitor in a semiconductor device according to a third embodiment of the present invention will be below explained in detail.

Figure 3A:
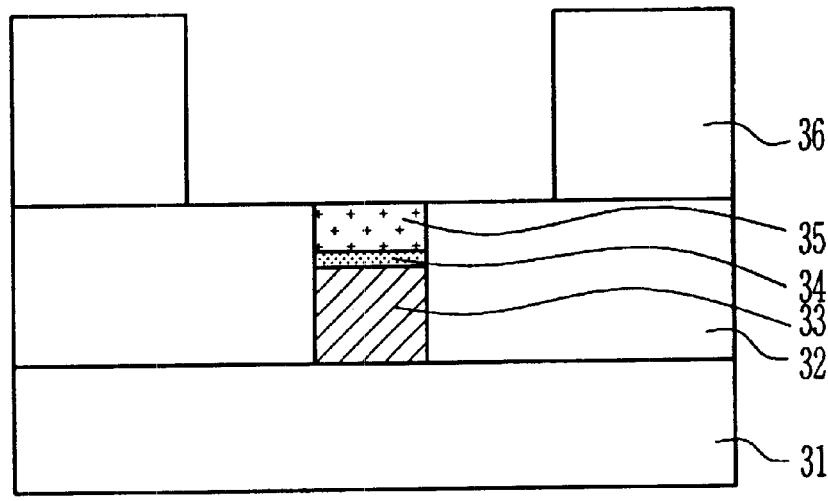
FIG. 3A~FIG. 3D are cross-sectional views of devices for illustrating a method of manufacturing a capacitor in a semiconductor device according to a third embodiment of the present invention.

Referring now to FIG. 3A, after forming an interlayer insulating film 32 in a semiconductor substrate 31 in which given structure are formed, a given region of the interlayer insulating film 32 is etched to form a contact hole through which a given region of the semiconductor substrate 31 is exposed. Then, a contact plug 33, an ohmic contact layer 34 and a diffusion prevention film 35 are sequentially stacked/filled in the contact hole. Generally, a polysilicon film is used as the contact plug 33, a Ti film is used as the ohmic contact layer 34, and a TiN film is used as the diffusion prevention film 35. Next, an oxide film 36 is formed on the entire structure and is then patterned to expose the contact hole.

Figure 3B:
Figure 3B:
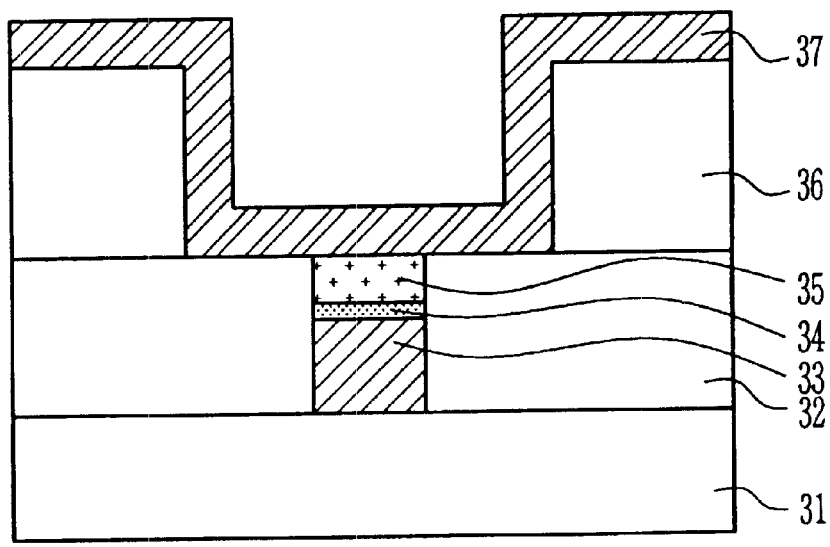

Referring now to FIG. 3B, a wafer is mounted on the chamber and is then maintained at the temperature of 250~350° C. under the pressure of 0.1~10 Torr. Tri(2,4-octanedionato)ruthenium or bis(ethyl-cyclopentadienyl) ruthenium of a gas state being a raw material of Ru and oxygen, and a $NH_3$ gas are introduced into the chamber to deposit a Ru film 37 in thickness. At this time, oxygen as a reaction gas for dissolving the raw material is introduced with the amount of 10~100 sccm and the $NH_3$ gas for reducing oxygen is introduced with the amount of 100~2000 sccm.

Figure 3C:
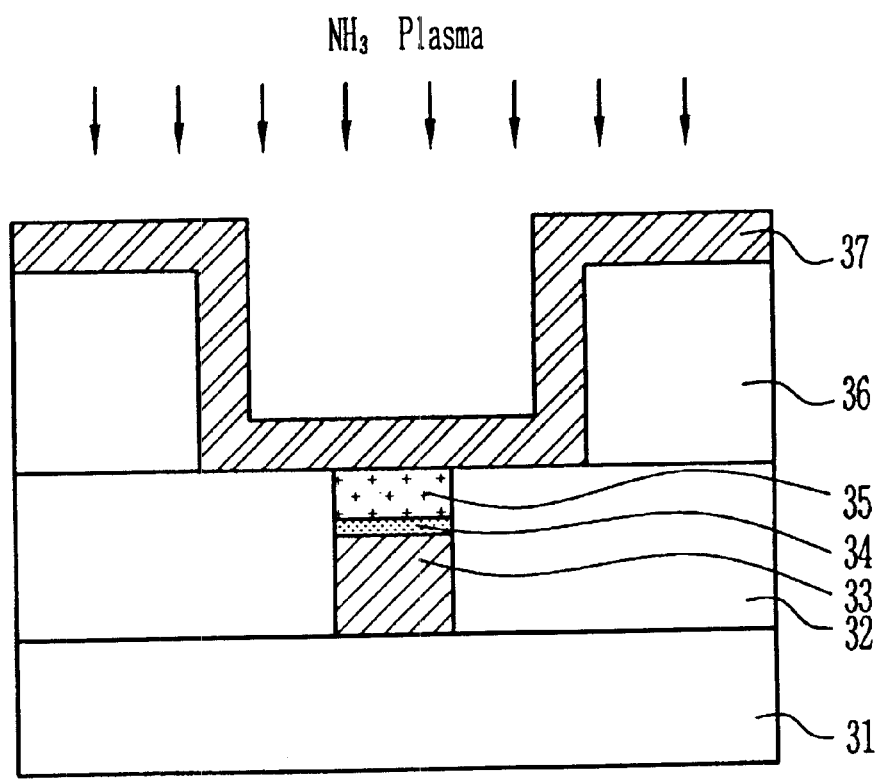

Referring now to FIG. 3C, with introduction of the raw material of Ru and oxygen stopped, the Ru film 37 is experienced by $NH_3$ plasma process, thus removing oxygen existing on the surface of the Ru film 37. At this time, the $NH_3$ plasma process is implemented by introducing a $NH_3$ gas of 10~1000 sccm with the RF power of 30~500W for 1~5 minutes. The above deposition process of the Ru film 37 and the plasma process are repeated to form the Ru film 37 having a desired thickness.

Figure 3D:
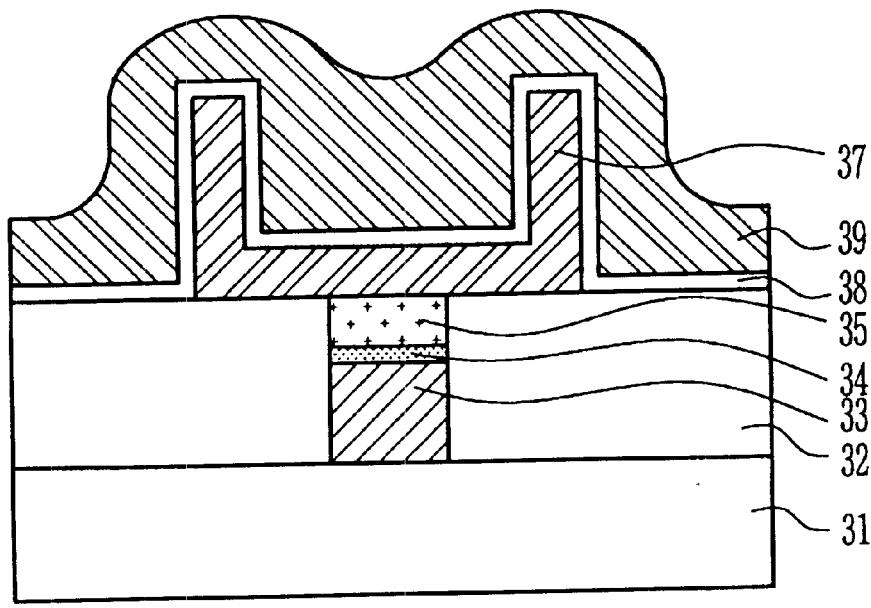

Referring now to FIG. 3D, after removing the Ru film 37 formed on the oxide film 36, the oxide film is removed to form a cylinder-shape lower electrode. Then, a $Ta_2O_5$ film 38 is formed on the entire structure including the lower electrode. At this time, the $Ta_2O_5$ film 38 is formed by introducing tantalum ethylate ($Ta(OC_2H_5)_5$) of a gas state being a raw material and oxygen of 10~1000 sccm with the temperature of the chamber on which the wafer is mounted kept at 300~450° C. and the pressure is kept at 0.1~2 Torr. Tantalum ethylate is made in a gas state in the vaporizer in which the temperature of 170~190° C. is maintained. In order to remove carbon existing in the $Ta_2O_5$ film 38, $N_2O$ plasma or $UV/O_3$ plasma is performed at the temperature of 300~500° C. Also, in order to crystalline the $Ta_2O_5$ film 38, a rapid thermal process is performed using $N_2O$ gas and $O_2$ gas at the temperature of 500~650° C. Then, a TiN film or a Ru film is deposited on the entire structure to form an upper electrode 39. At this time, in order to deposit the Ru film used as the upper electrode, the same method of forming the Ru film used the lower electrode may be performed or a general method may be performed.

Figure 4:
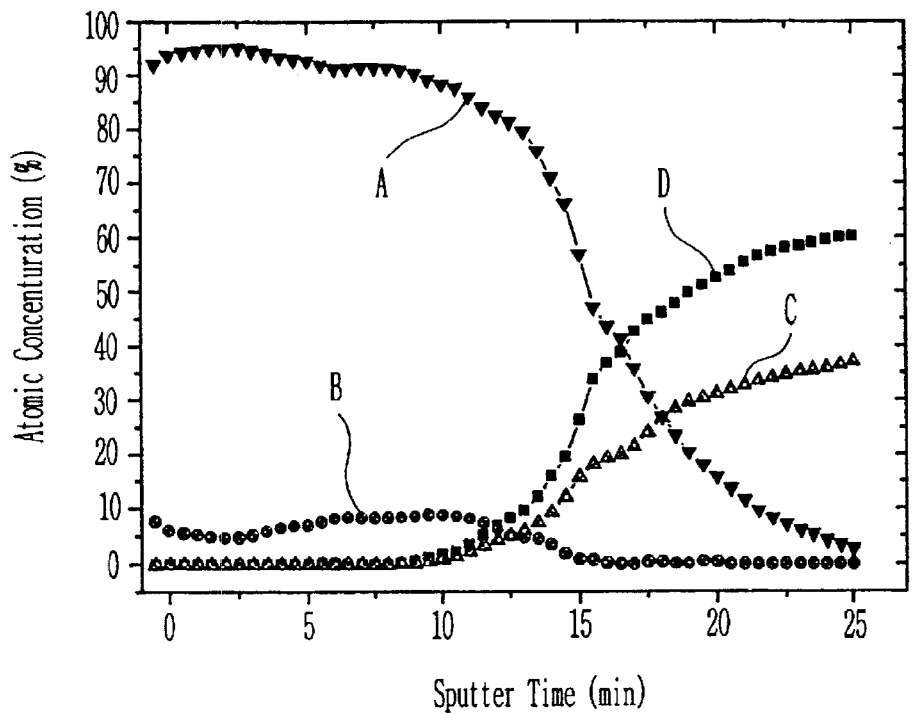
FIG. 4 is an AES graph illustrating the amount of oxygen contained in a Ru film formed by a conventional method.

FIG. 4 is an AES graph illustrating the amount of oxygen contained in a Ru film formed by a conventional method. It shows the distribution of atoms depending on the sputtering time when oxygen and argon are introduced as a reaction gas. In the drawing, A, B C and D indicate Ru, oxygen contained in Ru, silicon and oxygen contained in silicon, respectively.

Figure 5:
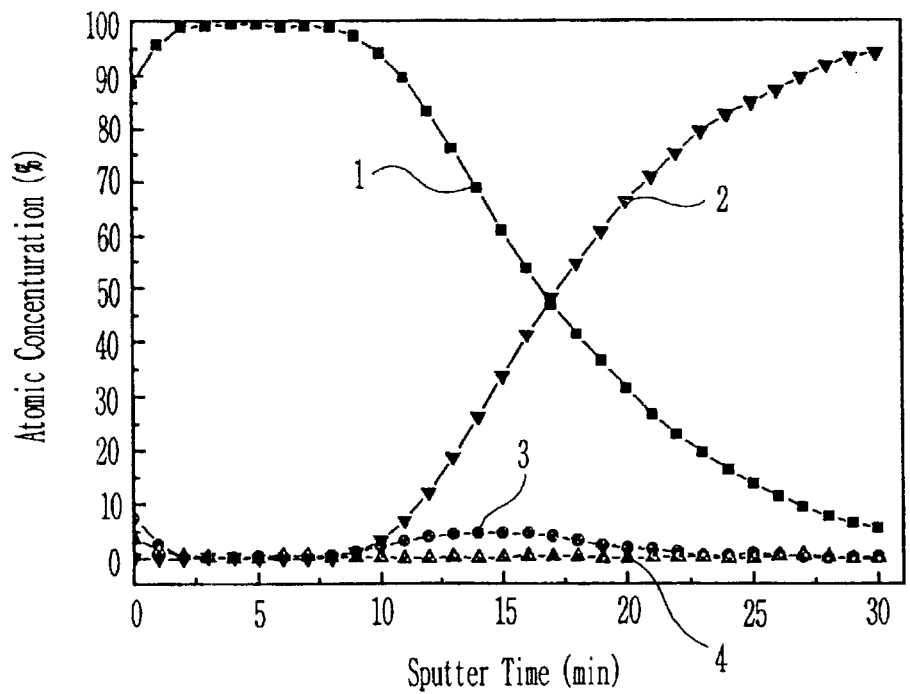
FIG. 5 is an AES graph illustrating the amount of oxygen contained in a Ru film formed according to a first embodiment of the present invention.

FIG. 5 is an AES graph illustrating the amount of oxygen contained in a Ru film formed according to a first embodiment of the present invention. It shows the distribution of atoms depending on the sputtering time when oxygen of a reaction gas and a $NH_3$ gas for reducing oxygen are introduced to deposit a Ru film. In the drawing, 1, 2, 3 and 4 indicate Ru, silicon, oxygen contained in Ru and nitrogen contained in Ru, respectively.

Figure 6:
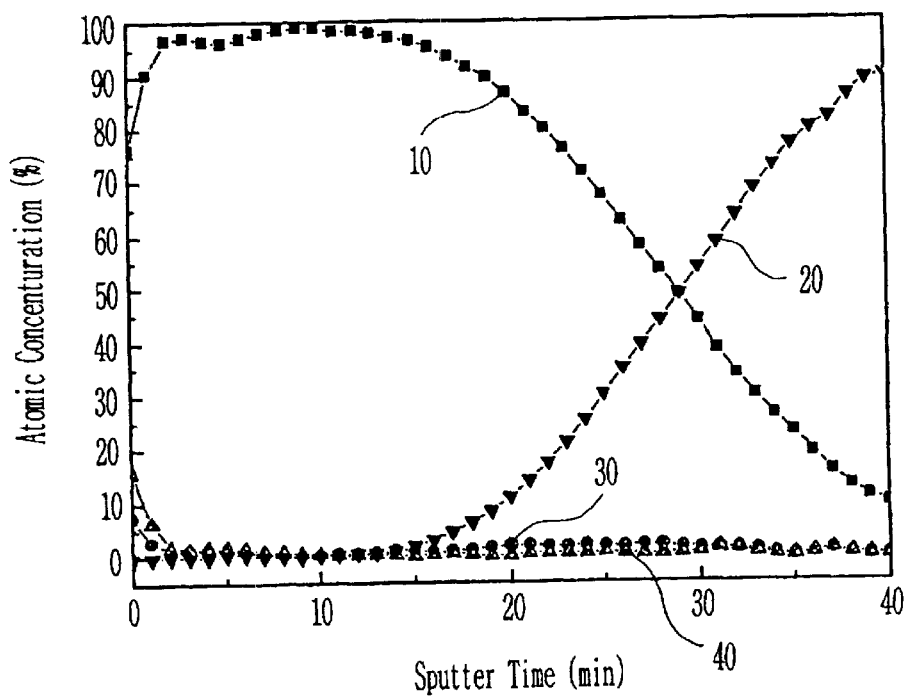
FIG. 6 is an AES graph illustrating the amount of oxygen contained in a Ru film formed according to a second embodiment of the present invention.

FIG. 6 is an AES graph illustrating the amount of oxygen contained in a Ru film formed according to a second embodiment of the present invention. It shows the distribution of atoms depending on the sputtering time when after depositing partially Ru using oxygen as a reaction gas, a Ru film is deposited by repeatedly performing a $NH_3$ plasma process in order to remove oxygen contained in Ru. In the drawing, 10, 20, 30 and 40 indicate Ru, silicon, oxygen contained in Ru and nitrogen contained in Ru, respectively.

Figure 7:
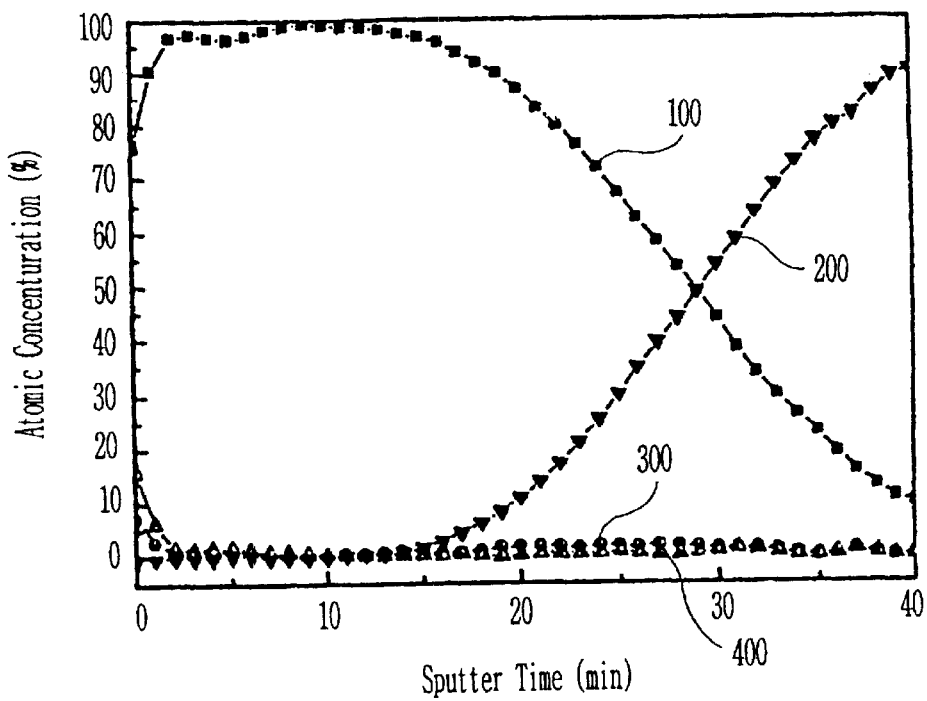
FIG. 7 is an AES graph illustrating the amount of oxygen contained in a Ru film formed according to a third embodiment of the present invention.

FIG. 7 is an AES graph illustrating the amount of oxygen contained in a Ru film formed according to a third embodiment of the present invention. It shows the distribution of atoms depending on the sputtering time when oxygen of a reaction gas and a $NH_3$ gas for reducing oxygen are introduced to partially deposit a Ru film and a $NH_3$ plasma process is then performed to remove oxygen contained in Ru. In the drawing, 100, 200, 300 and 400 indicate Ru, silicon, oxygen contained in Ru and nitrogen contained in Ru, respectively.

From the comparison of FIG. 4 with FIG. 5, and FIG. 6 with FIG. 7, it could be seen that oxygen is rarely found in the Ru film formed according to embodiments of the present invention. Therefore, it is possible to completely exclude the possibility that a diffusion prevention film can be oxidized during the annealing process.

As mentioned above, according to the present invention, oxygen is not contained in a Ru film used as a lower electrode. Therefore, the present invention can prevent oxidization of a diffusion prevention film due to oxygen during the annealing process and thus improve reliability of devices.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed are:

1. A method of manufacturing a capacitor in a semiconductor device, comprising the steps of:
   mounting a semiconductor substrate in which given structures are formed onto a furnace and then maintaining the furnace at given temperature and pressure;
   introducing a Ru raw material, oxygen and a $NH_3$ gas into said furnace to form a Ru film on said semiconductor substrate; and
   forming a lower electrode by patterning said Ru film and then forming a dielectric film and an upper electrode on the entire structure.

2. The method of manufacturing a capacitor in a semiconductor device according to claim 1, wherein said furnace is maintained at the temperature of 250~350° C. and the pressure of 0.1~10 Torr.

3. The method of manufacturing a capacitor in a semiconductor device according to claim 1, wherein the Ru raw material includes Tri(2,4-octanedionato) ruthenium or bis(ethyl-cyclopentadienyl)ruthenium of a gas state.

4. The method of manufacturing a capacitor in a semiconductor device according to claim 1, wherein the oxygen is introduced at the amount of 10~100 sccm.

5. The method of manufacturing a capacitor in a semiconductor device according to claim 1, wherein the $NH_3$ gas is introduced at the amount of 100~2000 sccm.

6. The method of manufacturing a capacitor in a semiconductor device according to claim 1, wherein the dielectric film includes a $Ta_2O_5$ film.

7. The method of manufacturing a capacitor in a semiconductor device according to claim 6, wherein the $Ta_2O_5$ film is formed by introducing tantalum ethylate ($Ta(OC_2H_5)_5$) of a gas state and oxygen of 10~1000 sccm, with the temperature of the furnace on which said semiconductor substrate is mounted kept at 300~450° C. and the pressure is kept at 0.1~2 Torr.

8. The method of manufacturing a capacitor in a semiconductor device according to claim 1, further including performing a rapid thermal process after forming the dielectric film.

9. The method of manufacturing a capacitor in a semiconductor device according to claim 8, wherein the plasma includes one of $N_2O$ plasma, $O_2$ plasma or a mixture plasma of $N_2$ and $O_2$.

10. The method of manufacturing a capacitor in a semiconductor device according to claim 8, wherein the rapid thermal process is performed at the temperature of 500~700° C. for 1~5 minutes.

11. The method of manufacturing a capacitor in a semiconductor device according to claim 1, wherein the upper electrode is formed of either a TiN film or a Ru film.

12. A method of manufacturing a capacitor in a semiconductor device, comprising the steps of:

mounting a semiconductor substrate in which given structures are formed onto a furnace and then maintaining the furnace at given temperature and pressure;

forming a Ru film on said semiconductor substrate by introducing a Ru raw material and oxygen into said furnace and then performing a $NH_3$ plasma process for said Ru film; and forming a lower electrode by patterning said Ru film and then forming a dielectric film and an upper electrode on the entire structure.

13. The method of manufacturing a capacitor in a semiconductor device according to claim 12, wherein said furnace is maintained at the temperature of 250~350° C. and the pressure of 0.1~10 Torr.

14. The method of manufacturing a capacitor in a semiconductor device according to claim 12, wherein the Ru raw material includes Tri(2,4-octanedionato) ruthenium or bis (ethyl-cyclopentadienyl)ruthenium of a gas state.

15. The method of manufacturing a capacitor in a semiconductor device according to claim 12, wherein the oxygen is introduced at the amount of 50~800 sccm.

16. The method of manufacturing a capacitor in a semiconductor device according to claim 12, wherein said $NH_3$ plasma process is implemented by introducing a $NH_3$ gas of 10~1000 sccm with the RF power of 30~500W for 1~5 minutes.

17. The method of manufacturing a capacitor in a semiconductor device according to claim 12, wherein said Ru film formation and said plasma process are repeated to form said Ru film having a desired thickness.

18. The method of manufacturing a capacitor in a semiconductor device according to claim 12, wherein the dielectric film includes a $Ta_2O_5$ film.

19. The method of manufacturing a capacitor in a semiconductor device according to claim 18, wherein the $Ta_2O_5$ film is formed by introducing tantalum ethylate ($Ta(OC_2H_5)_5$) of a gas state and oxygen of 10~1000 sccm, with the temperature of the furnace on which said semiconductor substrate is mounted kept at 300~450° C. and the pressure is kept at 0.1~2 Torr.

20. The method of manufacturing a capacitor in a semiconductor device according to claim 18, further including performing $N_2O$ plasma or $UV/O_3$ plasma process at the temperature of 300–500° C. and performing a rapid thermal process using $N_2$ gas and $O_2$ gas at the temperature of 500–650° C., after forming said dielectric film.

21. The method of manufacturing a capacitor in a semiconductor device according to claim 12, wherein the upper electrode is formed of either a TiN film or a Ru film.

22. A method of manufacturing a capacitor in a semiconductor device, comprising the steps of:

mounting a semiconductor substrate in which given structures are formed onto a furnace and then maintaining the furnace at given temperature and pressure;

forming a Ru film by introducing a Ru raw material, oxygen and a $NH_3$ gas into said furnace and then performing a $NH_3$ plasma process for said Ru film; and forming a lower electrode by patterning said Ru film and then forming a dielectric film and an upper electrode on the entire structure.

23. The method of manufacturing a capacitor in a semiconductor device according to claim 22, wherein said furnace is maintained at the temperature of 250~350° C. and the pressure of 0.1~10 Torr.

24. The method of manufacturing a capacitor in a semiconductor device according to claim 22, wherein the Ru raw material includes Tri(2,4-octanedionato) ruthenium or bis (ethyl-cyclopentadienyl)ruthenium of a gas state.

25. The method of manufacturing a capacitor in a semiconductor device according to claim 22, wherein the oxygen is introduced at the amount of 10~100 sccm.

26. The method of manufacturing a capacitor in a semiconductor device according to claim 22, wherein the $NH_3$ gas is introduced at the amount of 100~2000 sccm.

27. The method of manufacturing a capacitor in a semiconductor device according to claim 22, wherein said $NH_3$ plasma process is implemented by introducing a $NH_3$ gas of 10~1000 sccm with the RF power of 30~500W for 1~5 minutes.

28. The method of manufacturing a capacitor in a semiconductor device according to claim 22, wherein said Ru film formation and said plasma process are repeated to form said Ru film having a desired thickness.

29. The method of manufacturing a capacitor in a semiconductor device according to claim 22, wherein the dielectric film includes a $Ta_2O_5$ film.

30. The method of manufacturing a capacitor in a semiconductor device according to claim 29, wherein the $Ta_2O_5$ film is formed by introducing tantalum ethylate ($Ta(OC_2H_5)_5$) of a gas state and oxygen of 10~1000 sccm, with the temperature of the furnace on which said semiconductor substrate is mounted kept at 300~450° C. and the pressure is kept at 0.1~2 Torr.

31. The method of manufacturing a capacitor in a semiconductor device according to claim 22, further including performing $N_2O$ plasma or $UV/O_3$ plasma process at the temperature of 300~500° C. and performing a rapid thermal process using $N_2$ gas and $O_2$ gas at the temperature of 500~650° C., after forming said dielectric film.

32. The method of manufacturing a capacitor in a semiconductor device according to claim 22, wherein the upper electrode is formed of either a TiN film or a Ru film.

* * * * *